United States Patent [19]

Crook et al.

[11] Patent Number: 5,703,519

[45] Date of Patent: Dec. 30, 1997

[54] DRIVE CIRCUIT AND METHOD FOR CONTROLLING THE CROSS POINT LEVELS OF A DIFFERENTIAL CMOS SWITCH DRIVE SIGNAL

[75] Inventors: David T. Crook, Summerfield; Ernest T. Stroud, Greensboro, both of N.C.

[73] Assignee: Analog Devices, Inc., Norwood, Mass.

[21] Appl. No.: 593,843

[22] Filed: Jan. 30, 1996

[51] Int. Cl.$^6$ .......................... H03K 17/13; H03K 17/16; H03K 19/03

[52] U.S. Cl. .......................... 327/387; 327/391; 327/384; 327/175; 326/27; 326/115

[58] Field of Search ...................... 327/563, 259, 327/52, 374, 376, 377, 379, 380, 381, 382, 384, 65, 389, 391, 387, 551, 175, 172; 326/115, 27, 83, 121

[56] References Cited

U.S. PATENT DOCUMENTS

| | | | |
|---|---|---|---|
| 4,617,523 | 10/1986 | Taylor | 330/258 |
| 4,777,451 | 10/1988 | Tohyama | 330/253 |
| 4,922,135 | 5/1990 | Mollier et al. | 326/115 |
| 5,541,532 | 7/1996 | McCall | 326/83 |

OTHER PUBLICATIONS

Cremonesi et al., "A 100-MHz CMOS DAC for Video-Graphic Systems", *IEEE Journal of Solid-State Circuits*, vol. 24, No. 3, Jun. 1989, pp. 635-639.

Bastiaansen et al., "A 10-b 40-MHz 0.8-µm CMOS Current-Output D/A Converter", *IEEE Journal of Solid-State Circuits*, vol. 26, No. 7, Jul. 1991, pp. 917-921.

*Primary Examiner*—Timothy P. Callahan
*Assistant Examiner*—Terry L. Englund
*Attorney, Agent, or Firm*—Koppel & Jacobs

[57] ABSTRACT

A drive circuit and method for shaping the pair of complementary digital signals that drive a conventional CMOS switch are presented. The method adjusts the digital signals' duty cycles to set their cross point voltage levels so that at the cross points the voltage level at the CMOS switch's reference node is undisturbed with respect to its fully switched level. The drive circuit includes two pair of diode connected PMOS load transistors and NMOS load transistors that are connected at a pair of output terminals and a pair of switches. In one state, the NMOS load transistor is turned on while the switch cuts off its signal current so that the shaped digital signal's voltage at the output terminal is reduced to a precision limited low voltage. In the other state, the NMOS load transistor is turned off while the switch directs the signal current through the PMOS load transistor so that the shaped digital signal's voltage at the output terminal is increased to the PMOS load transistor's gate-to-source voltage. The CMOS transistors' channel geometries and the amount of signal current are selected to set the duty cycle of the shaped digital signals and thereby set the optimum cross point voltage levels.

27 Claims, 5 Drawing Sheets

Time (Nanoseconds)

DRIVE CIRCUIT AND METHOD FOR CONTROLLING THE CROSS POINT LEVELS OF A DIFFERENTIAL CMOS SWITCH DRIVE SIGNAL

BACKGROUND OF THE INVENTION

1. Field of the Invention

This invention relates to shaping the drive signal characteristics for a differential Complementary Metal Oxide Semiconductor (CMOS) switch and more specifically to a drive circuit and method for controlling the voltage level of the drive signal's cross points to reduce the spectral distortion in the CMOS switch's output signal.

2. Description of the Related Art

Digital-to-Analog Convertors (DACs) are used to convert a sequence of digital codewords into an analog voltage or current signal. In differential digital circuits, each bit of the codeword can be represented by a pair of complementary digital signals that switch in opposite directions between high and low voltages, e.g. 5 V and 0 V, so that the signals have complementary logic states, i.e. 0 and 1, and which intersect at cross points half way between their high and low voltages, e.g. 2.5 V. In theory, these signal pairs could be binary weighted, as a function of the bit's position, and summed together to produce the analog signal. However, the digital signals are only controlled with sufficient accuracy to switch the digital circuitry, and thus are not precise enough to accurately construct the analog signal. Instead, the digital signals are used to control high speed differential electrical switches that switch between precision limited low and high signal levels. These signals are binary weighted and summed together to give the analog signal. As the speed of digital circuitry increases, the slew rate (switching speed) and accuracy of the switches become increasingly important factors in minimizing distortion of the analog signal.

The ideal response for a differential switch is a complementary pair of zero-order-hold (ZOH) or stair-stepped waveforms with infinite positive and negative slew rates (a discontinuity at the sampling instances) and a 50% duty cycle. The positive slew rate is the ten-to-ninety percent change in the amplitude divided by the rise time and the negative slew rate is the ninety-to-ten percent change in the amplitude divided by the fall time. The rise and fall times are defined as the time it takes for the waveform to rise from 10% to 90% and fall from 90% to 10%, respectively, of the difference between the high and low voltage levels. The duty cycle is defined as the ratio of the width of a high voltage level, i.e. a positive pulse, to the sum of the widths of the positive and negative pulses. A 50% duty cycle, where the widths of the positive and negative pulses are equal, is preferred because the associated spectrum comprises only odd harmonics. In practice switches can not switch instantly, and will overshoot and ring before settling to the low and high voltage levels. Also, the switches typically do not have equal positive and negative slew rates. Furthermore the large signal swing of the digital signal will feedthrough and distort the switches' output signals.

FIGS. 1a and 1b are known PMOS and NMOS implementations 10 and 12, respectively, of a differential CMOS switch of the type used in a precision DAC. As shown in FIG. 1a, the CMOS switch includes a pair of differentially connected PMOS drive transistors 14 and 16. The PMOS transistors 14 and 16 have gates 18 and 20, sources 22 and 24, and drains 26 and 28, respectively. The transistors' sources 22 and 24 are connected together at a reference node 30. A current source 32 is connected between a high supply voltage terminal 34, typically 3–5 V, and the reference node 30, and supplies signal current, suitably 10–300 µA, to both PMOS transistors. The transistors' drains 26 and 28 are connected to one side of resistors 36 and 38, respectively, at output terminals 40 and 42. The other side of resistors 36 and 38, suitably 0 to 1k Ω, is connected to a low supply voltage terminal 44, typically ground. The PMOS transistors have parasitic capacitances which are modeled by a pair of gate-to-drain capacitors 46 and 48 that are connected between the gate 18 and drain 26 of transistor 14 and between the gate 20 and drain 28 of transistor 16, respectively, and by a single capacitor 50 that is connected between the reference node 30 and an AC ground 52. The NMOS implementation 12 shown in FIG. 1b is a mirror image of the PMOS implementation 10.

A pair of complementary single ended digital signals, which together form a differential drive signal, are applied to the gates 18 and 20 of PMOS transistors 14 and 16, respectively, so that one of the transistors is turned on thereby conducting all of the signal current through its resistor and switching the single ended output signal at its output terminal high and the other transistor is turned off thereby cutting off the signal current to its resistor and switching the single ended output signal at its output terminal low. As a result, the differential output signal between the output terminals switches between precision limited high and low voltage levels with complementary logic to that of the differential drive signal.

To preserve the logic of the differential drive signal, DACs use a drive circuit to invert the single ended digital signals and apply them to the CMOS switch. A well known drive circuit is a digital inverter which inverts the signals while maintaining the high and low voltage levels, the 50% duty cycle, and the 50% cross point voltage levels. In one state, the digital inverter applies a low (on) voltage level, e.g. 0 V, to the gate 18 and a high (off) voltage level, e.g. 5 V, to the gate 20 to turn the PMOS transistor 14 fully on and the PMOS transistor 16 fully off. As a result, substantially all of the signal current flows through transistor 14's highly conductive source-to-drain region and through resistor 36, while the current flowing through resistor 38 is limited to the PMOS transistor's leakage current, which is approximately zero. This switches the single ended output signal at output terminal 40 high to approximately 15 mV and switches the single ended output signal at output terminal 42 low to approximately 0 V causing the differential output signal between the gates to switch high to approximately 15 mV. Similarly, when the voltages at gates 18 and 20 are driven high and low, respectively, the single ended output signals at output terminals 40 and 42 switch to 0 V and 15 mV, respectively causing the differential voltage signal between the gates to switch low to approximately −15 mV.

At the two fully switched positions, the voltage at the reference node 30 is offset from the voltage level at the gate of the fully on transistor by that transistor's fully on gate-to-source voltage $V_{gs}$ (on), which is given by:

$$V_{gs}(on) = \left(\frac{Is}{\beta}\right)^{0.5} + V_t \tag{1}$$

where Is is the total signal current supplied by the current source, $V_t$ is the transistor threshold voltage, and $\beta$ is the transistor gain, which is a function of the transistors' channel geometry, i.e. gate width W and length L.

At the onset of switching, the PMOS transistor 14 remains on as the voltage at its gate 18 increases. At the same time, the PMOS transistor 16 remains off as its gate voltage is initially reduced from 5 V. This causes an imbalance which disrupts the voltage at reference node 30 pushing it upwards. As a result, a portion of the signal current is diverted to charge the parasitic capacitor 50, which has the effect of modulating the signal current flowing through resistor 36. Similarly, at the end of the switching transient, PMOS transistor 16 is fully on as its gate voltage is reduced towards 0 V. This pulls the voltage at the reference node 30 back towards its fully switched voltage level, which causes the parasitic capacitance 50 to discharge and modulate the signal current flowing through resistor 38.

At the cross points, the gates of the PMOS transistors are driven at midsupply, i.e. 2.5 V. At this condition if the voltage at reference node 30 is not Vt or higher than the gate voltages due to the parasitic capacitance 50 then both PMOS devices are reverse biased and momentarily turned off. In general, both devices are off when the voltage difference between the reference node and the input is less than the device's threshold voltage. This in effect lengthens the "off" time relative to the "on" time, which causes a distortion error in the duty cycle of the single ended output signals, which in turn generates even order harmonics in the differential output signal. Furthermore, the entire signal current is momentarily diverted through the parasitic capacitor 50, which further charges the capacitor and disrupts the voltage at reference node 30. As a result, the switch has non-symmetrical positive and negative slew rates and an increased settling time. Non-symmetrical slew rates generate even order harmonics in the differential output signal while the increased settling time will degrade the signals' odd and even order harmonics.

Furthermore, the single ended digital signals' large swing (between 0 and 5 V in 1 ns) causes overshoot and undershoot by capacitively coupling the signals' high DV/DT leading edges onto the output terminals via the gate-to-drain capacitors 46 and 48. This appears as a glitch in the single ended output signals, which further degrades the settling time and causes odd and/or even order harmonics in the differential output signal.

FIGS. 2a, 2b and 2c show the single ended digital signals 54 and 56, the inverted signals 58 and 60, and the switches' single ended output signals 62 and 64, respectively, for the digital inverter and CMOS switch described above. As shown in FIGS. 2a and 2b, the digital signals 54 and 56 and the inverted signals 58 and 60 switch between 0 and 5 V at a slew rate of approximately 5 V/ns with cross point voltage levels of 2.5 V. As shown in FIG. 2c, the output signals 62 and 64 switch between 0 V and 15 mV and have a substantive duty cycle error. However, as a result of the distortion mechanisms described above, the rising edge of the output signals overshoots the high voltage level by almost 50% and requires approximately 20% of the pulse width to settle. This degrades the spectral quality of the CMOS switch's differential output signal, which in turn degrades the performance of the DAC.

Cremonesi et al., "A 100-MHz CMOS DAC for Video-Graphic Systems," IEEE Journal of Solid-State Circuits, Vol. 24, No. 3, pp.635–639, June 1989, disclose a single ended drive circuit that comprises a differential pair of NMOS transistors. Cremonesi applies a fixed bias voltage to the gate of one of the transistors while driving the gate of the other transistor with a single digital signal to switch a differential pair of digital signals at the transistors' drains. Cremonesi's drive circuit both inverts the digital signal and reduces its voltage swing to approximately 2 V. This has the effect of reducing capacitive coupling to the CMOS switches' output terminals, which in turn reduces the amount of overshoot.

As shown in FIG. 3 of his paper, Cremonesi's drive circuit maintains the cross point voltage levels at 50% of the swing voltage. As a result, the voltage at node A, shown in FIG. 1 of the paper, is disrupted at the cross points, which causes the parasitic capacitance to charge and discharge. Furthermore, Cremonesi teaches controlling the bias voltage to achieve symmetrical switching, and specifically states that "this mismatch is not controllable if the differential stage is driven by a differential input" p. 636, col. 2, line 17.

Bastiaansen et al., "A 10-b 40-MHz 0.8-μm CMOS Current-Output D/A Converter," IEEE Journal of Solid-State Circuits, Vol. 26, No. 7, pp. 917–921, July 1991, disclose a level-shift stage (drive circuit) that includes a pair of differentially driven NMOS transistors whose sources are connected together to supply a constant signal current. A pair of diode connected NMOS load transistors are connected between the NMOS transistors' respective drains and a positive supply voltage. A pair of current sources supply bias currents at the drains of the respective NMOS transistors. The "high" switching level is determined by the value of the bias current together with the geometry of the load transistors. The sum of the signal and bias currents determine the "low" switching level. Bastiaansen teaches selecting these values to generate a swing voltage that is as small as possible, e.g. 1 V, to drive the CMOS switch to reduce the capacitively coupling and, hence the overshoot errors as much as possible.

A 1 V swing may be inadequate to ensure that the CMOS switch switches between fully on and fully off positions for all variations in process, temperature and supplies. For example, processing errors that create transistor mismatch or a large temperature change can shift the operating point of the CMOS switch. Furthermore, the rising and falling edges conduct 2 μA and 37 μA, respectively. As a result the positive slew rate will likely be less than the negative slew rate, which will induce harmonic distortion in the output signal of the CMOS switch.

SUMMARY OF THE INVENTION

In view of the above problems, the present invention provides a method and drive circuit for shaping a pair of complementary digital signals to drive a differential CMOS switch and reduce the harmonic distortion in the switch's output signal.

This is accomplished by adjusting the digital signals' duty cycles to set their cross point voltage levels so that the voltage level at the CMOS switch's reference node is the same at the cross points as it is when the switch is fully switched and by reducing the voltage swing between the signals' high and low levels. The drive circuit has two differentially connected sides that respond to the complementary digital signals to generate the complementary shaped digital signals at a pair of output terminals. Each side of the drive circuit includes a diode connected PMOS load transistor and an NMOS load transistor connected at the output terminal and a switch. In one state, the NMOS load transistor is turned on while the switch cuts off its signal current so that the voltage across its source-to-drain, and hence, the shaped digital signal's voltage at the output terminal is reduced to a precision limited low voltage. In the other state, the NMOS load transistor is turned off while the switch directs the signal current through the PMOS load transistor so that the shaped digital signal's voltage at the output terminal is increased to the PMOS load transistor's gate-to-source voltage. The CMOS transistors' channel (gate width and length) geometries and the amount of signal current are selected to set the duty cycle of the shaped digital signals and thereby set the optimum cross point voltage levels.

These and other features and advantages of the invention will be apparent to those skilled in the art from the following detailed description of preferred embodiments, taken together with the accompanying drawings, in which:

DETAILED DESCRIPTION OF THE INVENTION

Figure 1A:
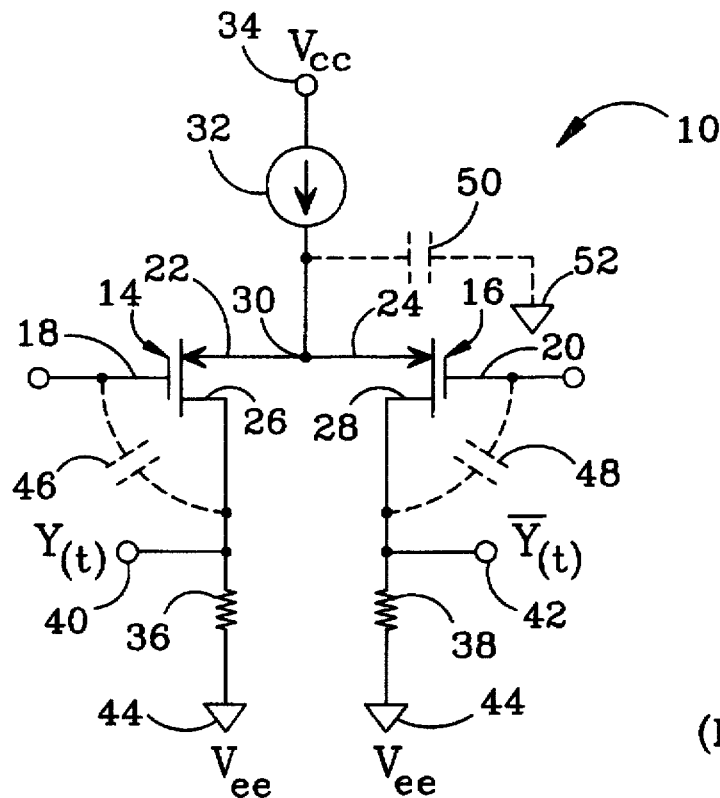
FIGS. 1a and 1b, as described above, are schematic diagrams of PMOS and NMOS implementations, respectively, of a known differential CMOS switch.
Figure 1B:
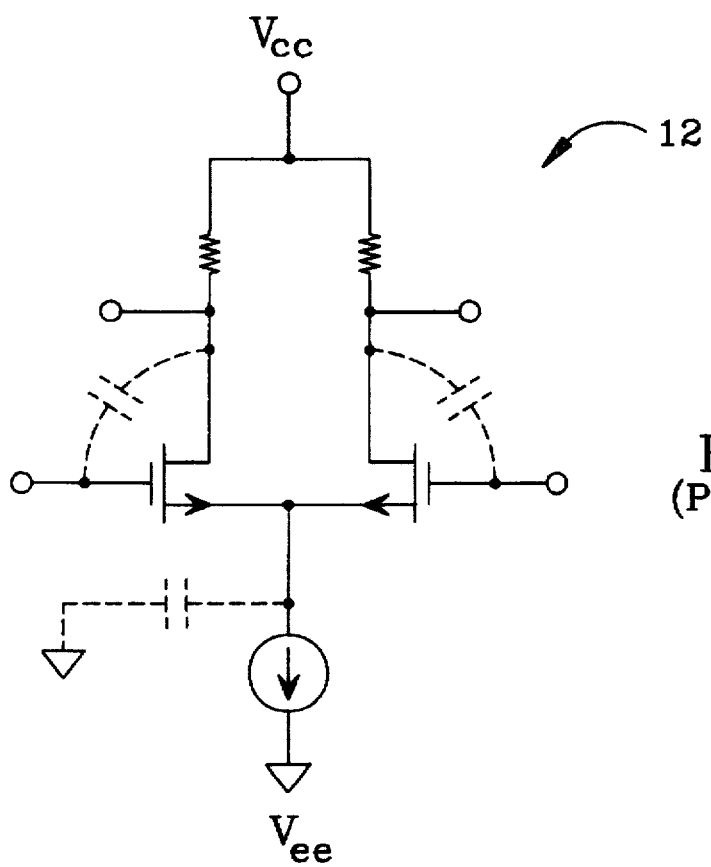

The present invention provides a method and drive circuit implementation for shaping a pair of complementary single ended digital signals to reduce the harmonic distortion in the differential output signal of a CMOS switch of the type shown in FIGS. 1a and 1b. This is accomplished 1) by reducing the single ended digital signals' swing voltages to reduce signal feedthrough while ensuring complete switching and 2) by adjusting the digital signals' voltage levels at their cross points such that the voltage at the reference node at the cross points is equal to the voltage at the reference node when the CMOS switch is fully switched thereby substantially eliminating capacitive charging and discharging at the cross points. Although the parasitic capacitor still charges and discharges at the beginning and end of the switching transient, optimizing the switch performance at the cross points has the effect of reducing the average error and settling time. The cross point voltage levels are adjusted in such a manner that the desired duty cycle and the matched positive and negative slew rates are maintained in the switch's differential output signal.

For the CMOS switches shown in FIGS. 1a and 1b, the optimum cross point voltage levels are determined through the following analysis. The variation in the current at the reference node is given by:

$$\frac{I1}{Is} = 1 - \frac{I2}{Is} + \frac{Icap}{Is} \qquad (2)$$

where Is is the signal current, I1 and I2 are the portions of the signal current that flow through the respective drive transistors, and Icap is the parasitic capacitor current. To avoid disrupting the voltage at the reference node, the parasitic capacitor must be held stable such that $$\frac{Icap}{Is} = 0.$$

To achieve this, $$Is = I1 + I2 \qquad (3)$$

The currents I1 and I2 are given by the well known CMOS transistor equations:

$$I1 = \beta(V_{gs1} - V_t)^2 \qquad (4)$$

$$I2 = \beta(V_{gs2} - V_t)^2 \qquad (5)$$

where $\beta = (k'W/2L)$ is the transistor gain where $k'$ is a constant, $V_t$ is the threshold voltage, and $V_{gs1}$ and $V_{gs2}$ are the transistors' gate-to-source voltages, which at the cross points are, by definition, equal. Thus, substituting the representations for I1 and I2 into equation 3, and solving for $V_{gs}(cp) = V_{gs1} = V_{gs2}$ gives the gate-to-source voltage at the cross point as:

$$V_{gs}(cp) = \left(\frac{Is}{2\beta}\right)^{0.5} + V_t \qquad (6)$$

To maintain the voltage at the reference node at its switched value, the digital signals' cross point voltage levels $V_g(cp)$ must be offset from the voltage level that turns the drive transistors on by $V_{gs}(on) - V_{gs}(cp)$. Subtracting equation 6 from 1 gives:

$$V_g(cp) = \left(1 - \frac{1}{\sqrt{2}}\right)\left(\frac{Is}{\beta}\right)^{0.5} \qquad (7)$$

For the PMOS implementation, the digital signals' cross point voltages are set above the low voltage level by the amount given in equation 7 to satisfy the current relationship given in equation 3, and hence the requirement that $$\frac{Icap}{Is} = 0$$

is satisfied. For the NMOS implementation, the digital signals' optimum cross point voltage levels are offset from the high voltage level by the amount given in equation 7.

Figure 2A:
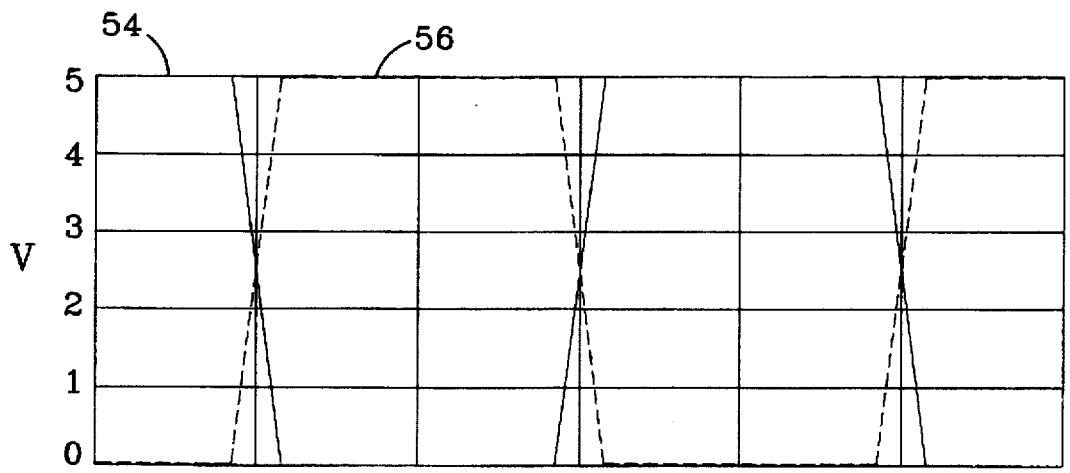
FIGS. 2a, 2b, and 2c, as described above, are plots of a simulated digital signal, the drive signal produced by a known inverter, and the output signal of the CMOS switch of FIG. 1a, respectively.
Figure 2B:
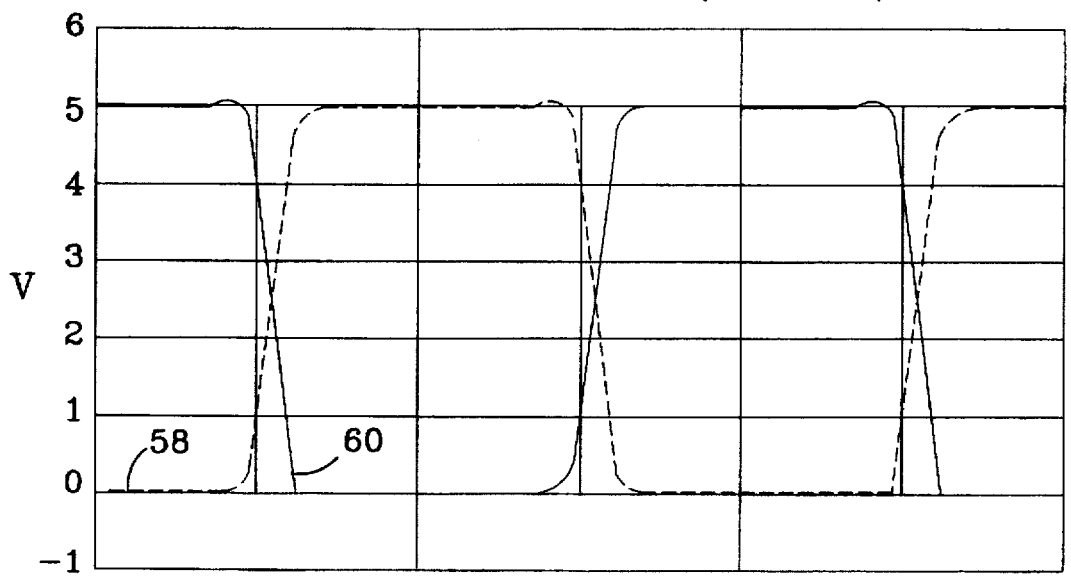
Figure 2C:
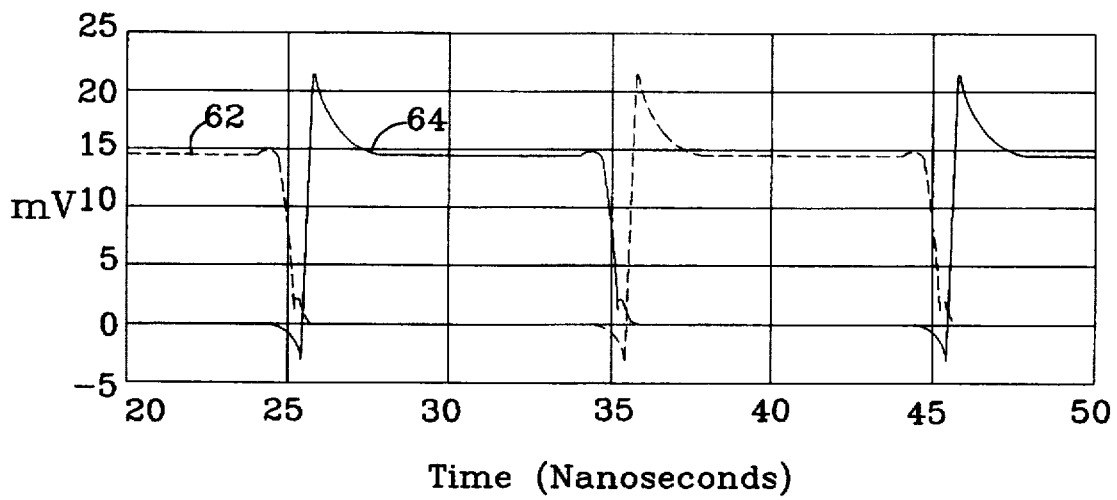
Figure 3A:
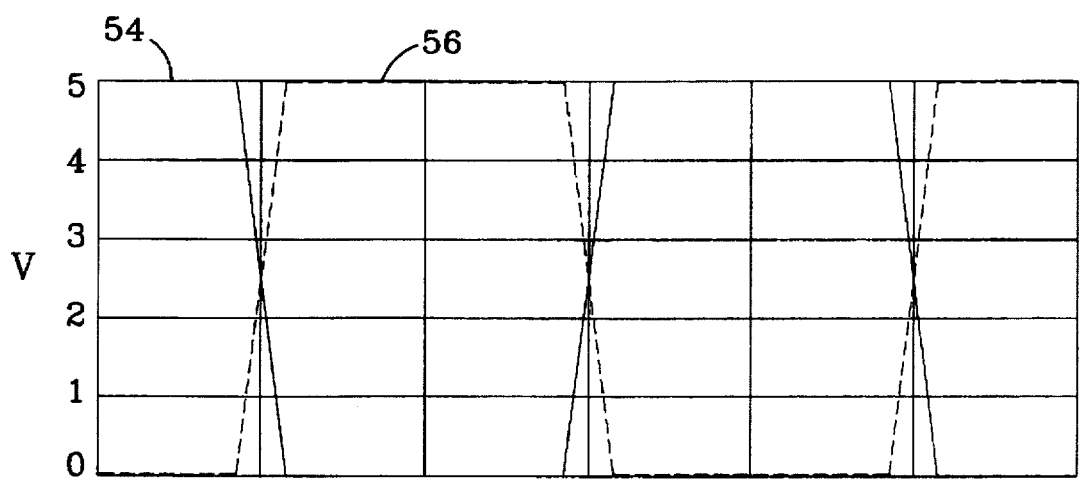
FIGS. 3a, 3b and 3c are plots of a simulated digital signal, the drive signal produced in accordance with the present invention, and the output signal of the CMOS switch of FIG. 1, respectively.
Figure 3B:
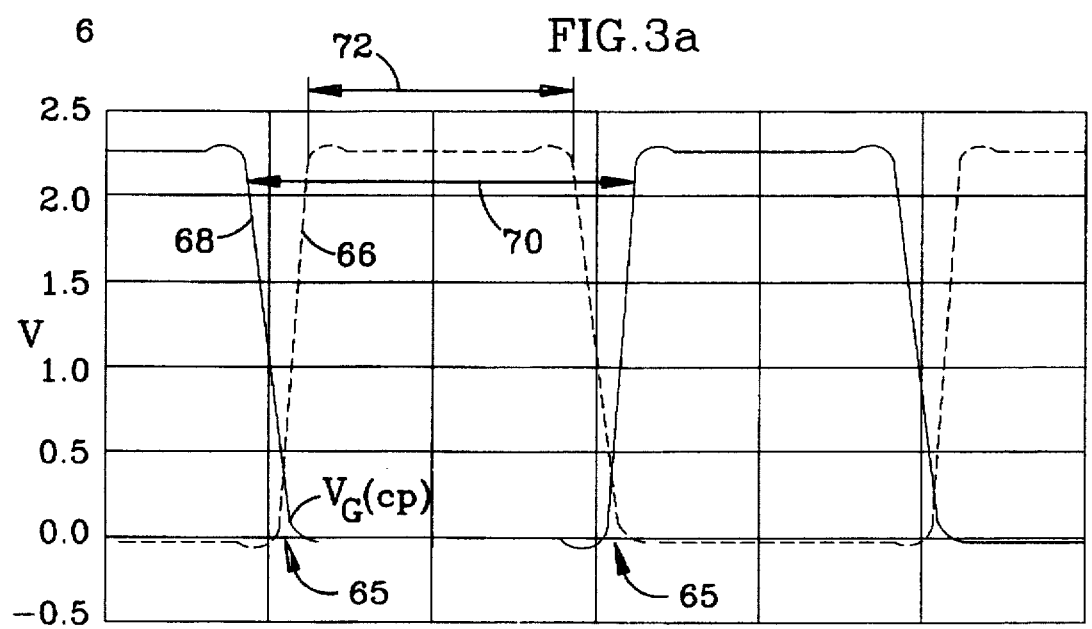
Figure 3C:
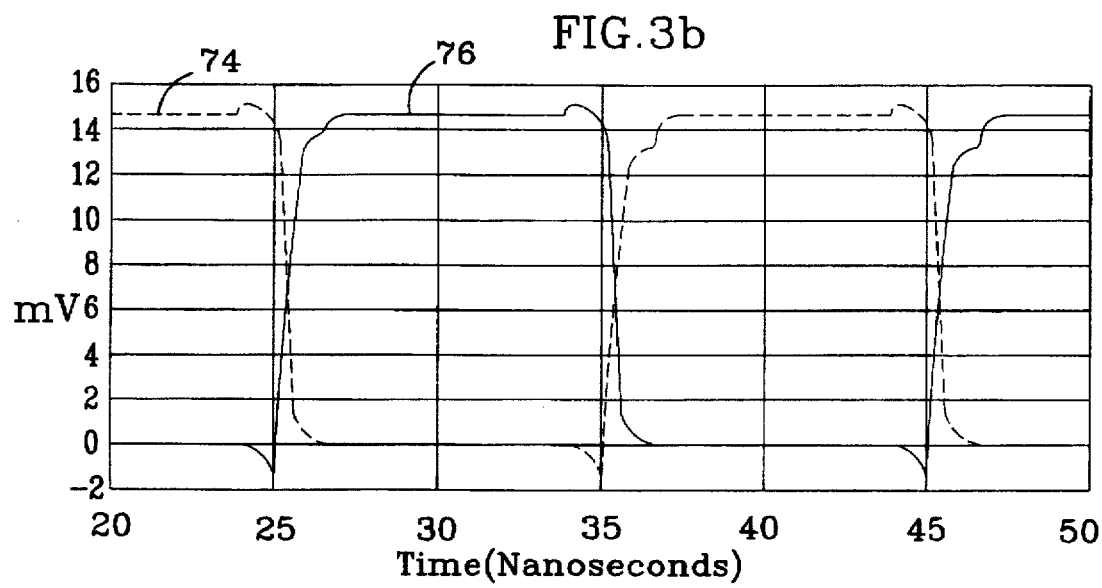

The method for shaping the digital signals and the results of optimizing the shaped digital signals' cross point voltage levels for the PMOS implementation are depicted in FIGS. 3a, 3b, and 3c. FIG. 3a, which is the same as FIG. 2a, shows the pair of complementary single ended digital signals 54 and 56. In accordance with the invention, the digital signals 54 and 56 are shaped by reducing their swing voltage from 5 V to 2.2 V and adjusting their duty cycle away from the desired duty cycle, e.g. 50%, to move the voltage levels at the cross points 65 to their optimum values and produce the shaped digital signals 66 and 68. For the example shown, the signal current is 100 µA and the transistor gain is approximately 323 µA/V², and thus from equation 7, the optimum cross point voltages are approximately 0.16 V. The equations used to model the transistors and the processing of the transistors are not exact, and hence the actual optimum cross point voltage levels will deviate slightly from the predicted values. As shown in FIG. 3b, the shaped digital signals have cross point voltage levels of approximately 0.2 V and a high voltage level of 2.2 V.

The duty cycle is reduced to approximately 48% so that the negative (low voltage) pulse 70 is wider than the positive (high voltage) pulse 72. This moves the cross point voltage levels downwards to their optimum values. Alternately, this can be viewed as delaying the onset of the rising edge with respect to the falling edge so that they are spaced apart, and thus intersect at a lower voltage. Conversely, for the NMOS switch shown in FIG. 1b, the duty cycle is increased so that the negative pulse is narrower than the positive pulse to move the cross point voltage levels upwards to their optimum values. In general, the duty cycle is adjusted so that the voltage level that turns the drive transistors on is held for a longer period of time than the voltage level that turns the transistors off. In both instances, the complementary shaped digital signals' positive and negative pulses are centered with respect to each other and their positive and negative slew rates are matched. As a result, the duty cycle of the differential drive signal remains at the desired 50% duty cycle, as demonstrated by the equal time periods between each successive cross point 65.

As shown in FIG. 3c, the CMOS switch's single ended output signals 74 and 76 switch between 0 V and 15 mV with minimal overshoot and ringing at the desired 50% duty cycle. As a result, the switch's differential output signal closely models the ideal stair step function, and thus has greatly reduced even and odd order harmonic distortion as compared to the known methods described above. If the cross point voltage levels are optimum, one half of the signal current should flow through each transistor and the output signals 74 and 76 should have voltage levels at 50% of their swing voltage, e.g. 7.5 mV. As shown in FIG. 3c, the voltage levels at the cross points 65 are approximately 7.8 mV.

Figure 4:
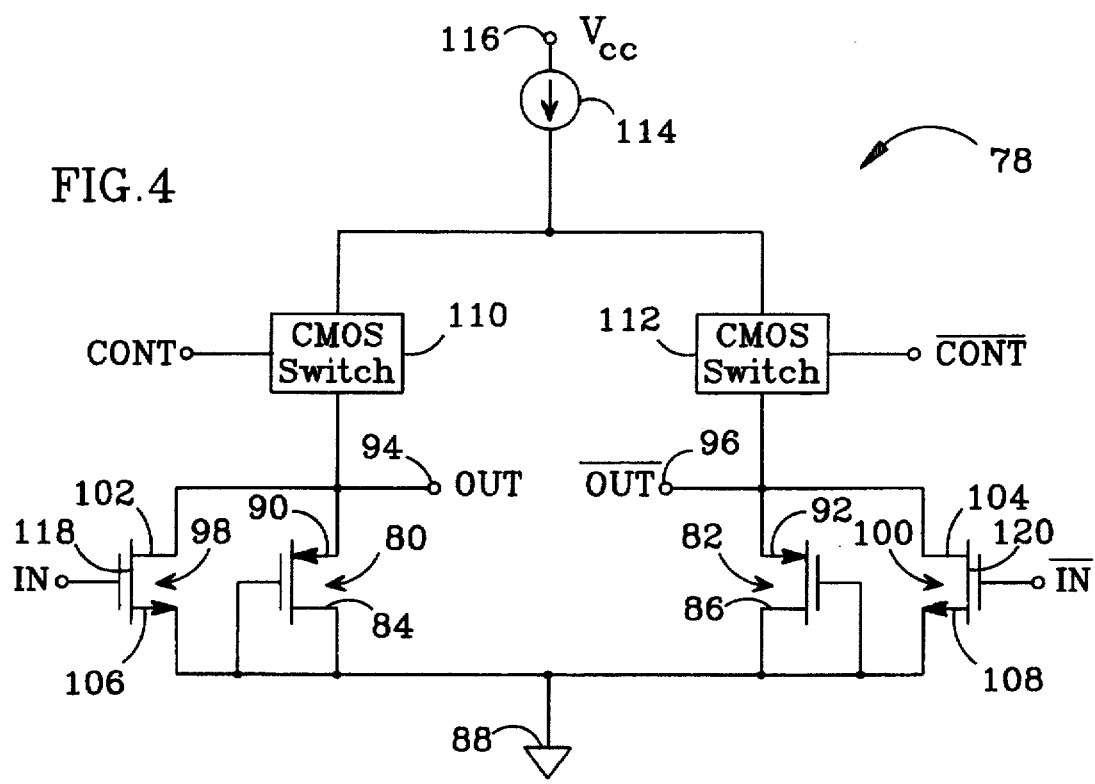
FIG. 4 is a simplified schematic diagram of a drive the simulated digital signal shown in FIG. 3a to produce the circuit in accordance with the present invention for shaping drive signal shown in FIG. 3b

FIG. 4 is a block diagram of a drive circuit 78 in accordance with the present invention for shaping a pair of complementary digital signals IN and $\overline{IN}$ (54 and 56 shown in FIG. 3a) to produce a pair of complementary shaped digital signals OUT and $\overline{OUT}$ (66 and 68 shown in FIG. 3b) for driving a CMOS switch of the types shown in FIG. 1a and 1b to reduce the harmonic distortion in the switch's differential output signal. The drive circuit 78 includes a pair of diode connected PMOS load transistors 80 and 82 having respective gate-drain junctions 84 and 86 that are connected to a low supply voltage terminal 88, typically ground. The load transistors sources 90 and 92 are connected to respective output terminals 94 and 96. A pair of NMOS load transistors 98 and 100 have drains 102 and 104 that are connected to the output terminals 94 and 96, respectively, and sources 106 and 108 that are connected to the low supply voltage terminal 88. A pair of CMOS switches 110 and 112 are connected between the output terminals 94 and 96, respectively, and a current source 114, which draws signal current from a high supply voltage terminal 116, typically 5 V.

The complementary digital signals IN and $\overline{IN}$ are applied to gates 118 and 120, respectively, of the NMOS load transistors 98 and 100 to alternately switch them on and off. A pair of digital control signals CONT and $\overline{CONT}$ are applied to the CMOS switches 110 and 112, respectively, so that, for example, when NMOS load transistor 98 is conducting the CMOS switch 110 is open so that all of the signal current is diverted to the other side of the drive circuit 78. As a result, the voltage between the transistor's drain 102 and source 106 is reduced to approximately zero volts. This pulls the voltage at output terminal 94 down to the voltage at the low supply terminal 88. Conversely, when the NMOS load transistor 98 is turned off, the CMOS switch 110 is closed so that all of the signal current flows through the PMOS load transistor 80. As a result, the voltage at output terminal 94 is switched to the PMOS load transistor's gate-to-source voltage.

The high voltage level of the shaped digital signals is equal to the gate-to-source voltage of the PMOS load transistor, and thus is set by the combination of the level of the signal current and the channel geometry, i.e. the gate, drain and source, of the PMOS load transistor. The shaped digital signals' positive slew rates are also set by this same combination. Higher current levels produce faster slew rates and larger transistor sizes reduce the slew rate because of the increased parasitic capacitance. The low voltage level is essentially ground because of the NMOS load transistor. The signals' negative slew rates are determined by the channel geometry of the NMOS load transistors. For small width to length ratios the signals will slew slower. The optimum cross point voltage levels are set by adjusting the signal current level and device geometries until the cross point voltage levels are approximately equal to those calculated in equation 7, the positive and negative slew rates are closely matched, and the desired duty cycle is maintained.

Figure 5:
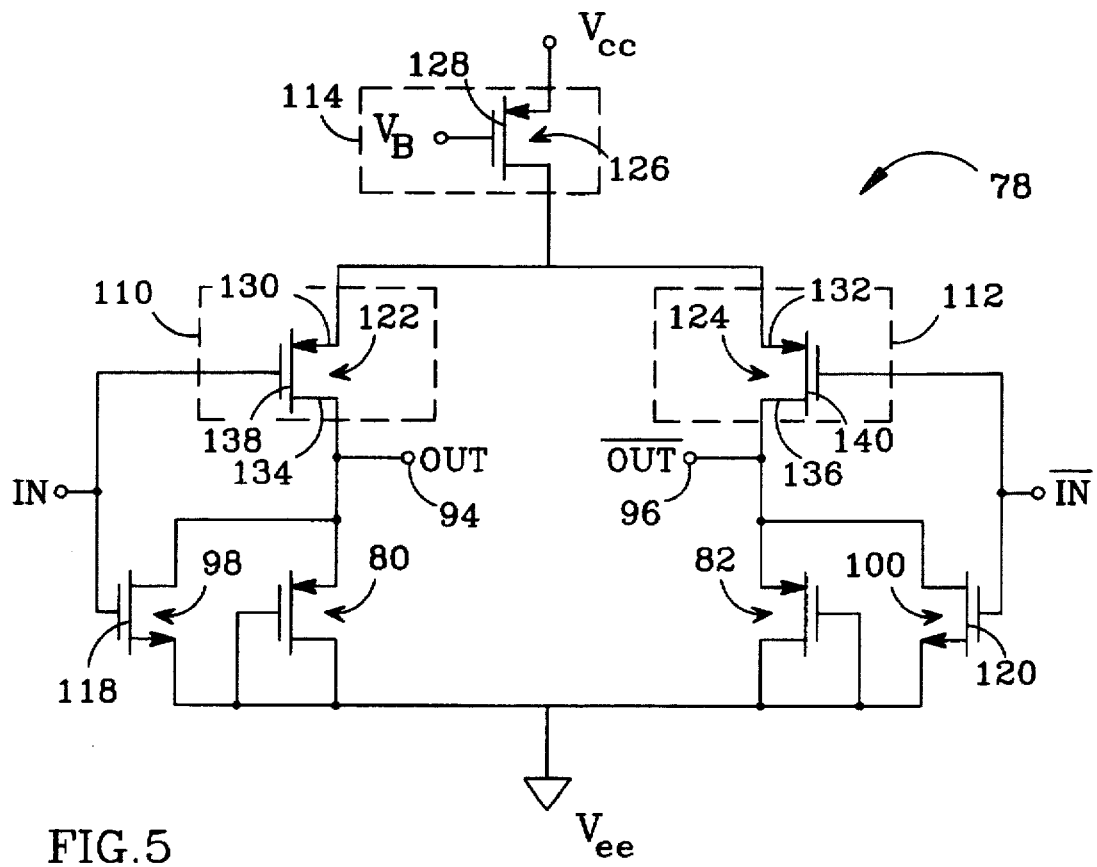
FIG. 5 is a schematic diagram of a first embodiment of the drive circuit shown in FIG. 4.

FIG. 5 shows a first embodiment of the drive circuit 78, in which the CMOS switches 110 and 112 comprise PMOS drive transistors 122 and 124, respectively, and the current source 114 includes a PMOS transistor 126. A bias voltage $V_B$ is applied to the gate 128 of the PMOS transistor 126 so that it continuously supplies the signal current to the sources 130 and 132 of PMOS drive transistors 122 and 124, respectively. The PMOS drive transistors' drains 134 and 136 are connected to the output terminals 94 and 96, respectively, and their gates 138 and 140 are tied to the NMOS load transistors' gates 118 and 120, respectively. Thus, the control signals CONT and $\overline{CONT}$ are the digital signals IN and $\overline{IN}$, respectively. When the signal IN is high, the NMOS load transistor 98 turns on and the PMOS drive transistor 122 cuts off, which drives the voltage at the output terminal 94 to ground.

In this embodiment, each time the signal switches the gate-to-source voltage across the PMOS load transistors must be recharged. This potentially could cause mismatch problems and slow the drive circuit. However, the results shown in FIGS. 3a, 3b, and 3c were obtained using this embodiment. Specifically, the signal current was set at 100 µA, the NMOS load transistors were designed with a channel width to length ratio of 1.6/0.6, the PMOS load transistors with a ratio of 20/0.6, and the PMOS drive transistors with a ratio of 10/0.6.

Figure 6:
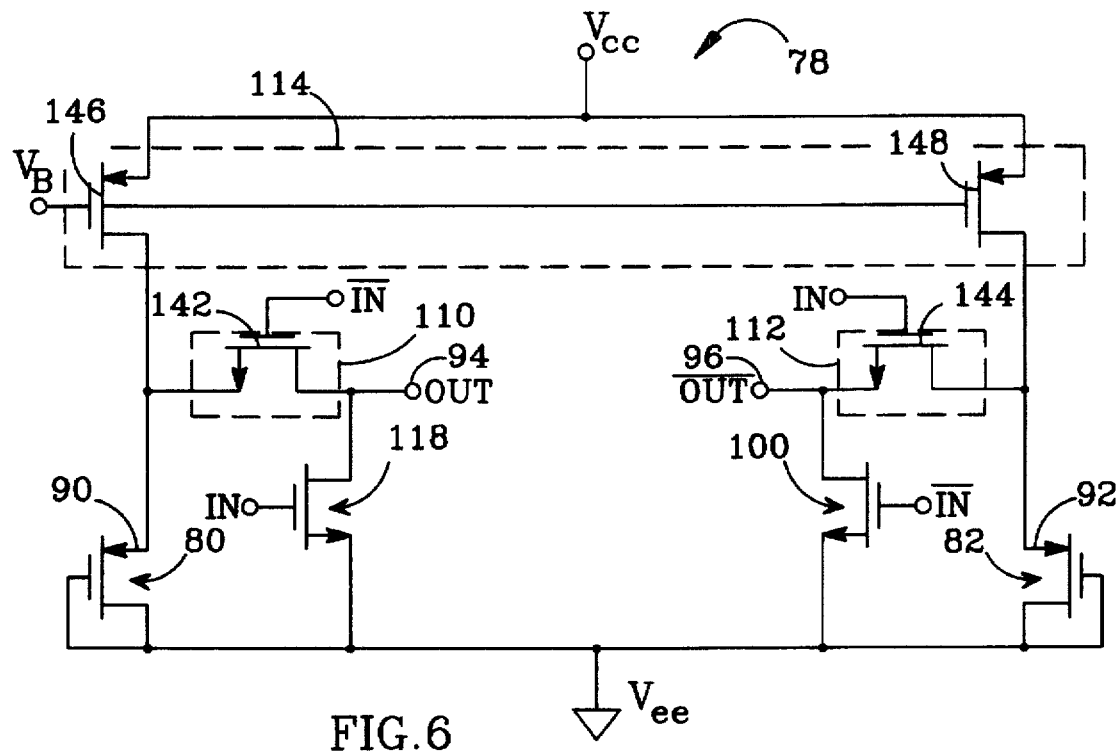
FIG. 6 is a schematic diagram of an alternate embodiment of the drive circuit shown in FIG. 4.

FIG. 6 shows an alternate embodiment of the drive circuit 78, in which the CMOS switches 110 and 112 comprise NMOS drive transistors 142 and 144, respectively, that are connected between the output terminals 94 and 96 and the sources 90 and 92, respectively, of the PMOS load transistors 80 and 82. The current source 114 includes a pair of PMOS transistors 146 and 148 that are biased to continuously supply the same amount of signal current to the PMOS load transistors 80 and 82, respectively. In this configuration, the gate-to-source voltages are maintained continuously and then switched to the appropriate output terminal through the NMOS drive transistors. This should increase the drive circuit's speed and reduce mismatch errors.

Figure 7:
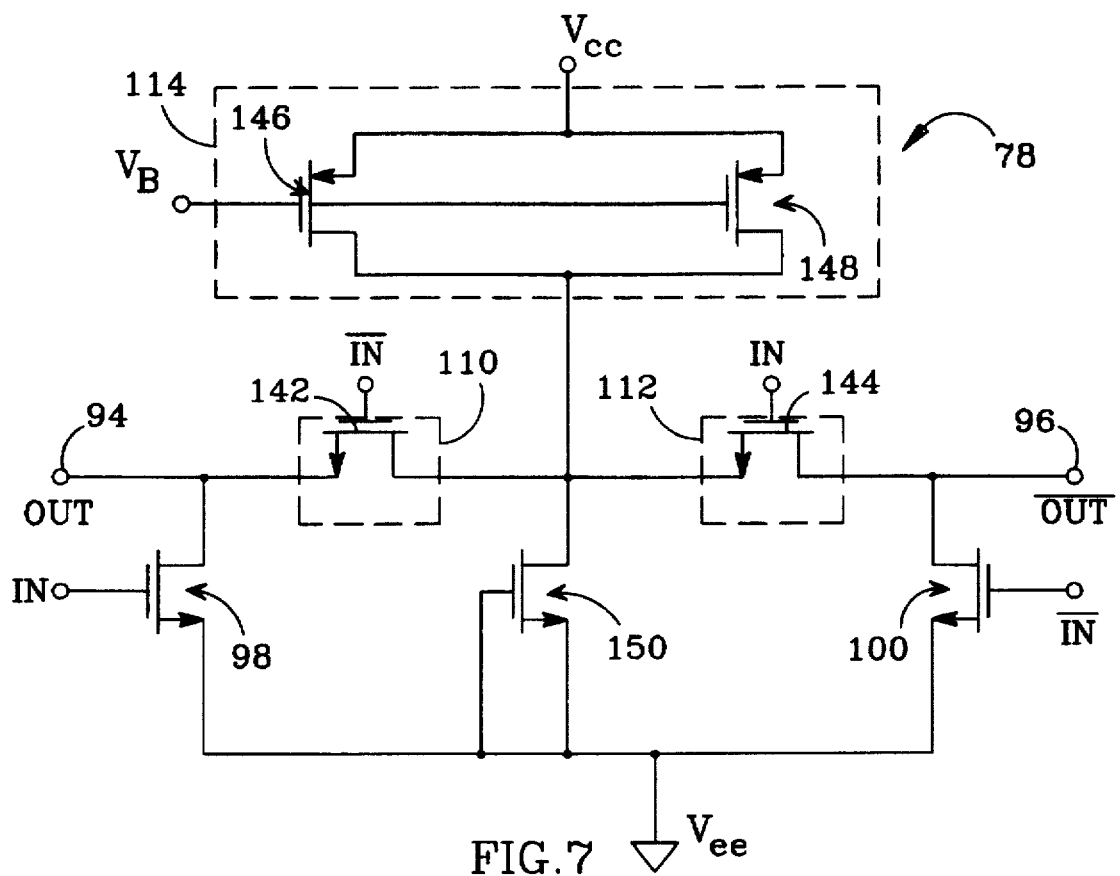
FIG. 7 is a schematic diagram illustrating a modification of the drive circuit shown in FIG. 6.

FIG. 7 illustrates a modification to the drive circuit embodiment 78 shown in FIG. 6. The pair of PMOS load transistors 80 and 82 are replaced by a single diode connected PMOS load transistor 150 whose gate-to-source voltage is maintained at the desired level and alternately switched between output terminal 94 and output terminal 96 through the NMOS drive transistors 142 and 144, respectively. This configuration completely eliminates mismatch by using a single transistor.

While several illustrative embodiments of the invention have been shown and described, numerous variations and alternate embodiments will occur to those skilled in the art. For example, the drive circuits could be implemented using the opposite transistor polarities in a topology that is the mirror image of that shown in FIGS. 4–7. Although the apparatus claims are drafted to conform with the specific topology shown in FIGS. 4–7, they should be interpreted to also encompass the mirror image topology using opposite polarity CMOS devices. Such variations and alternate embodiments are contemplated, and can be made without departing from the spirit and scope of the invention as defined in the appended claims.

We claim:

1. A method of driving a differential CMOS switch, said switch including a pair of CMOS transistors having respective gates that form a differential input, respective drains that form a differential output, and respective sources that are connected at a reference node and together receive a signal current, comprising:

applying a pair of complementary digital signals to the transistors' gates, respectively, said complementary digital signals switching between on and off voltage levels at a first duty cycle to produce a differential drive voltage signal across the differential input with a second duty cycle, said digital signals' on and off voltage levels causing said transistors to turn fully on and fully off, respectively, so that substantially all of the signal current flows through the transistor that is fully on to switch a pair of complementary analog signals at the transistors' respective drains thereby producing a differential output voltage signal across the differential output, a fully switched voltage level at said reference node being offset from the voltage level at the gate of the fully on transistor by that transistor's fully on gate-to-source voltage, the complementary digital signals intersecting at a pair of cross points at which the differential drive voltage signal is zero when switching between the on and off voltage levels so that said signal current is apportioned equally between the pair of transistors and their cross point gate-to-source voltages are reduced; and adjusting the complementary digital signals' first duty cycle away from the second duty cycle to move the voltage levels at the cross points towards the fully switched voltage level at the reference node to compensate for the reduction in the transistors' cross point gate-to-source voltages so that the voltage level at the reference node is maintained at approximately the fully switched voltage level thereby reducing the amount of distortion in the differential output voltage signal while maintaining the differential drive voltage signal's second duty cycle.

2. The method of claim 1, wherein said second duty cycle is set at 50%.

3. The method of claim 1, wherein said complementary digital and analog signals' respective on and off voltage levels are held for respective on and off periods whose relative lengths define the signals' respective duty cycles, the complementary digital signals' first duty cycle being adjusted by:

increasing and reducing the complementary digital signals' respective on and off periods so that they are longer and shorter than the complementary analog signals' on and off periods, respectively, such that said cross point voltage levels move towards the fully switched voltage at the reference node.

4. The method of claim 3, wherein the complementary digital signals switch between their on and off voltage levels at positive and negative slew rates, the complementary digital signals' first duty cycle being further adjusted by:

centering the complementary digital signals on and off periods with respect to each other; and equating the complementary digital signal's positive and negative slew rates so that the voltage levels at the cross points are the same and the differential drive voltage signal's second duty cycle is maintained.

5. The method of claim 1, wherein the complementary digital signals' first duty cycle is adjusted so that their voltage levels at the cross points are offset from the fully switched voltage level at the reference node by approximately:

$$V_t + \sqrt{\frac{I_s}{2\beta}}$$

where $V_t$ is the transistor threshold voltage, $I_s$ is the signal current, and $\beta$ is the transistor gain.

6. The method of claim 1, wherein the complementary analog signals are switched between high and low voltage levels, said complementary digital signals' first duty cycle being adjusted so that when switching the complementary analog signals intersect at a pair of cross points having voltage levels approximately halfway between their high and low voltage levels.

7. The method of claim 6, wherein said complementary digital signals' first duty cycle is controlled such that the complementary analog signals switch at said second duty cycle, which is different from the digital signals' first duty cycle.

8. The method of claim 1, further comprising:

reducing the difference between the complementary digital signals' on and off voltage levels to reduce gate-to-drain feedthrough in the CMOS switch.

9. A method of driving a differential CMOS switch, said switch including a pair of CMOS transistors having respective gates, drains, and sources, said sources being connected at a reference node and together conducting a signal current, and a parasitic capacitance at the reference node that charges and discharges when the voltage at the reference node is disturbed from a switched voltage level by receiving a portion of the signal current, comprising:

applying a pair of complementary digital signals to the transistors' gates, respectively, said complementary digital signals alternately switching the transistors on and off in opposition to each other to produce the switched voltage level at the reference node and to produce a pair of complementary analog signals at the transistors' respective drains, the complementary digital signals intersecting at a pair of cross points where they have cross point voltage levels when switching; and setting the complementary digital signals' cross point voltage levels so that at the cross points the voltage level at the reference node is approximately the same as the switched voltage level.

10. The method of claim 9, wherein the cross point voltage levels are offset from the switched voltage at the reference node by approximately:

$$V_t + \sqrt{\frac{I_s}{2\beta}}$$

where $V_t$ is the transistor threshold voltage, $I_s$ is the signal current, and $\beta$ is the transistor gain.

11. The method of claim 10, wherein the complementary digital signals have a first duty cycle, the cross point voltage levels being set by:

adjusting the complementary digital signals' first duty cycle to set the cross point voltage levels.

12. The method of claim 11, wherein said complementary analog signals form a differential output signal between the transistors' drains, said complementary digital signals' first duty cycle being further adjusted so that said differential output signal has a second duty cycle that is different from the complementary digital signals' first duty cycle.

13. The method of claim 12, wherein said duty cycles include on and off periods whose relative lengths determine the particular value of the duty cycle, said complementary digital signals' first duty cycle being adjusted so that its on and off periods are respectively longer and shorter than the on and off periods associated with the second duty cycle.

14. The method of claim 12, wherein said second duty cycle is approximately 50%.

15. The method of claim 9, further comprising:

reducing the difference between the complementary digital signals' on and off voltage levels to reduce gate-to-drain feedthrough in the CMOS switch.

16. A method of driving a differential CMOS switch, said switch including a pair of differentially connected PMOS transistors, each transistor having a gate, a drain, and a source, said sources being connected at a reference node and together receiving a signal current, comprising:

applying a pair of complementary digital signals to the PMOS transistors' gates, respectively, said complementary digital signals switching between low and high voltage levels at a first duty cycle of substantially 50% causing said transistors to turn fully on and fully off, respectively, so that substantially all of the signal current flows, through the transistor that is fully on to switch a differential output signal between the transistors' respective drains at a second duty cycle of substantially 50% and to produce a switched voltage level at said reference node which is offset from the low voltage level at the gate of the fully on transistor by that transistor's fully on gate-to-source voltage, the complementary digital signals' voltage levels intersecting at a pair of cross points when switching between the low and high voltage levels so that said signal current is apportioned equally between the pair of transistors and their cross point gate-to-source voltages are reduced from their fully on gate-to-source voltages; and reducing the complementary digital signals' first duty cycle below 50% to reduce the cross point voltage levels to compensate for the reduction in the transistors' cross point gate-to-source voltage so that the voltage level at the reference node is maintained at approximately the switched voltage.

17. The method of claim 16, wherein the complementary digital signals' first duty cycle is reduced so that the voltage levels at the cross points are offset from the switched voltage level at the reference node by approximately:

$$V_t + \sqrt{\frac{I_s}{2\beta}}$$

where $V_t$ is the transistor threshold voltage, $I_s$ is the signal current, and $\beta$ is the transistor gain.

18. The method of claim 16, further comprising:

reducing the difference between the complementary digital signals' high and low voltage levels to reduce gate-to-drain feedthrough in the CMOS switch.

19. A differential drive circuit that receives, a pair of complementary digital input signals that switch at a first duty cycle and together define a differential input drive signal and shapes them to produce a pair of complementary shaped signals that switch between high and low voltage levels at a second duty cycle and together define a differential shaped drive signal for driving a differential CMOS switch, said differential CMOS switch including a pair of CMOS output transistors having respective gates, drains and sources, said sources being connected at a reference node to receive a first signal current, said differential CMOS switch responding to the application of the differential drive signal at its gates by producing a differential output signal between said drains and producing a switched voltage level at said reference node when the transistors are fully switched, the differential drive circuit comprising:

a reference terminal for receiving a reference voltage;

a pair of diode connected PMOS load transistors having gate-drain junctions that are connected to said reference terminal and having sources that are electrically coupled to the output transistors' gates to apply high voltage levels thereto;

a pair of NMOS load transistors having gates that receive the respective complementary digital input signals, sources that are connected to said reference terminal, and drains that are connected to the output transistors' gates, said NMOS load transistors turning fully on in response to the digital input signals' high voltage levels to apply low voltage levels to the output transistors' gates;

a current source that supplies a second signal current; and a pair of single-ended CMOS switches that are connected to the output transistors' gates and the PMOS load transistors and respond to a pair of complementary digital control signals that are derived from said digital input signals, one said single-ended CMOS switch responding to a first control state by directing the second signal current through the PMOS load to switch the shaped signal applied at one of said output transistor's gate to a high voltage level that is offset from the reference voltage by the PMOS load transistors' gate-to-source voltage, and the other said single-ended CMOS switch responding to a second control state by cutting off the second signal current to the respective fully on NMOS load transistor to switch the other shaped signal applied at the other said output transistor's gate to a low voltage level that is substantially equal to the reference voltage, the pair of shaped signals intersecting at a pair of cross points when switching high-to-low and low-to-high, respectively, and together define the differential shaped drive signal;

said drive circuit's PMOS and NMOS load transistors having channel geometries defined by their gate width and length that together with the amount of said second signal current shift the shaped signals' second duty cycle with respect to the digital input signals' first duty cycle to a) set the voltage levels of the shaped signals at the cross points so that the voltage level at the reference node is maintained at the switched voltage level when the output transistors are at the cross points and to b) maintain the duty cycle of the differential shaped drive signal at approximately the same duty cycle as the differential input drive signal, wherein the connections of the pair of output transistor gates to the load transistors and the single-ended CMOS switches form respective driver output terminals.

20. The differential drive circuit of claim 19, wherein the shaped signals switch high-to-low and low-to-high at negative and positive slew rates, said NMOS load transistors' channel geometries setting the negative slew rate and said PMOS load transistors' channel geometries and the level of said second signal current together setting the positive rate so that the onsets of the low-to-high and high-to-low transitions are spaced apart in time to set the shaped signals' second duty cycle.

21. The differential drive circuit of claim 20, wherein the NMOS and PMOS load transistors' channel geometries and said level of said second signal current approximately match said negative and positive slew rates.

22. The differential drive circuit of claim 21, wherein the PMOS load transistors' channel geometries and the level of said second signal current set the PMOS load transistors' gate-to-source voltage at a level that is less than the voltage level that corresponds to the high voltage level of the input signals and is large enough to switch the CMOS transistors in said differential CMOS switch.

23. The differential drive circuit of claim 19, wherein the PMOS load transistors' sources are connected to the respective driver output terminals and the control signals are the input signals, said single-ended CMOS switches comprising:
a pair of PMOS drive transistors having gates that are connected to the respective driver NMOS load transistors gates to receive the pair of input signals, sources that are connected to the current source and drains that are connected to the respective driver output terminals, said PMOS drive transistors responding to low voltage levels by turning on to direct the second signal current through the PMOS load transistors connected at their drains so that the voltages at the respective driver output terminals switch high to the PMOS load transistor's gate-to-source voltage and responding to high voltage levels by turning off so that substantially zero signal current flows through the fully on NMOS load transistors connected at their drain so that the voltage at the respective driver output terminals switch low to approximately the reference voltage.

24. The differential drive circuit of claim 19, wherein said current source supplies said second signal current to one of said PMOS load transistors at a time and said control signals are the complements of said input signals, said single-ended CMOS switches comprising:
a pair of NMOS drive transistors having sources that are connected to the respective sources of said PMOS load transistors, drains that are connected to the respective drains of said NMOS load transistors, and gates, each connected pair of NMOS drive and NMOS load transistors responding to the application of one of said complementary input signals at their respective gates so that a) high and low voltage levels turn on the NMOS load transistor and turn off the NMOS drive transistor, respectively, thereby cutting off the second signal current to the NMOS load transistor so that the voltage at the respective output terminal switches low to approximately the reference voltage and b) low and high voltage levels turn off the NMOS load transistor and turn on the NMOS drive transistor, respectively, thereby switching the gate-to-source voltage across the PMOS load transistor to the respective output terminal to switch its voltage high.

25. The differential drive circuit of claim 24, wherein said pair of PMOS load transistors effectively comprise a single shared PMOS load transistor.

26. A method of driving a differential CMOS switch that includes a pair of CMOS output transistors having respective gates that form a differential input, respective drains that form a differential output, and respective sources that are connected at a reference node and together receive a signal current, comprising:

receiving a complementary pair of digital input signals that switch between on and off voltage levels at an approximately 50% duty cycle and intersect at a pair of cross points approximately halfway between the on and off voltage levels, said signals together defining a differential drive signal that switches between on and off voltage levels at a substantially 50% duty cycle and has a voltage level of zero at said cross points;

adjusting the digital input signals' duty cycle away from 50% to move their voltage levels at the cross points away from the halfway voltage level without changing the differential drive signal's 50% duty cycle; and applying the adjusted digital input signals to the differential input of the differential CMOS switch, said digital input signals' on and off voltage levels causing the switch's output transistors to turn fully on and fully off, respectively, so that substantially all of the signal current flows through the output transistor that is fully on to switch a pair of complementary analog signals at the output transistors' respective drains thereby producing a differential output voltage signal having a 50% duty cycle across the differential CMOS switch's differential output, the flow of substantially all of the signal current through one said output transistor producing a fully switched voltage level at said reference node that is offset from the voltage level at the gate of the fully on output transistor by that transistor's gate-to-source voltage, said differential drive signal's zero voltage level at the cross points causing the signal current to be apportioned equally between the pair of output transistors so that their gate-to-source voltages are reduced, said digital input signals' duty cycle being adjusted away from 50% to move their voltage levels at the cross points towards the fully switched voltage level at the reference node to compensate for the reduction in the output transistors' gate-to-source voltages so that the voltage level at the reference node is maintained at approximately the fully switched voltage level thereby reducing the amount of distortion in the CMOS switch's differential output voltage signal.

27. A precision limited switch, comprising:
a pair of input terminals for receiving a complementary pair of digital input signals that switch between on and off voltage levels at an approximately 50% duty cycle and, at a pair of cross points, intersect at a first cross point voltage that is approximately halfway between its on and off voltage levels, said pair of digital input signals together defining a differential input drive signal that switches at a substantially 50% duty cycle;
a drive circuit comprising:
a reference terminal for receiving a reference voltage;
a pair of output terminals;
a pair of diode connected PMOS load transistors having gate-drain junctions that are connected to said reference terminal and having sources that are electrically coupled to the respective output terminals;
a pair of NMOS load transistors having gates that receive the pair of digital input signals, sources that are connected to said reference terminal, and drains that are connected to the respective output terminals, said NMOS load transistors turning fully on in response to the digital input signals' high voltage levels;

a current source that supplies a first signal current; and a pair of single-ended CMOS switches that switch in response to the digital input signals to direct the first signal current to the PMOS load transistor opposite the fully on NMOS load transistor thereby switching a complementary pair of shaped digital signals at the output terminals between high voltage levels that are offset from the reference voltage by the PMOS load transistors' gate-to-source voltages and low voltage levels that are substantially equal to the reference voltage, said shaped signals together defining a differential shaped drive signal; and a differential CMOS switch that comprises a pair of CMOS output transistors having respective gates that form a differential input for receiving the differential shaped drive signal, drains that form a differential output, and sources, said sources being connected at a reference node to receive a second signal current, said differential shaped drive signal causing the pair of CMOS output transistors to turn fully on and fully off, respectively, so that substantially all of the second signal current flows through the output transistor that is fully on to switch a pair of complementary analog signals at the output transistors' respective drains, which together define a differential output voltage signal across the differential output, the flow of substantially all of the second signal current through one said output transistor producing a fully switched voltage level at said reference node that is offset from the voltage level at the gate of the fully on output transistor by that transistor's gate-to-source voltage, said digital shaped drive voltage signal having a zero voltage level at the cross points that causes the second signal current to be apportioned equally between the pair of output transistors so that their gate-to-source voltages are reduced, said PMOS and NMOS load transistors having channel geometries defined by their gate width and length that together with the amount of said first signal current set the shaped digital signals' duty cycle at a non-50% level so that a) the shaped digital signals cross point voltage levels compensate for the reduction in the output transistors' gate-to-source voltages at the cross points so that the voltage level at the reference node is maintained at the switched voltage and b) the duty cycles of the differential shaped drive signal and the differential output voltage signal are approximately 50%.

* * * * *